(12) United States Patent
Shohji

(10) Patent No.: US 6,569,262 B1
(45) Date of Patent: May 27, 2003

(54) LEAD-FREE SOLDER POWDER MATERIAL, LEAD-FREE SOLDER PASTE AND A METHOD FOR PREPARING SAME

(75) Inventor: Ikuo Shohji, Moriyama (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/511,478

(22) Filed: Feb. 23, 2000

(30) Foreign Application Priority Data

Feb. 23, 1999 (JP) .......................................... 11-044016

(51) Int. Cl.[7] .............................................. B23K 35/24
(52) U.S. Cl. ........................................... 148/24; 75/255
(58) Field of Search ............................... 148/24; 75/255

(56) References Cited

U.S. PATENT DOCUMENTS

| 4,806,309 A | 2/1989 | Tulman |
| 4,929,423 A | 5/1990 | Tucker et al. |
| 5,328,660 A | 7/1994 | Gonya et al. |
| 5,344,607 A | 9/1994 | Gonya et al. |
| 5,368,814 A | 11/1994 | Gonya et al. |
| 5,393,489 A | 2/1995 | Gonya et al. |
| 5,411,703 A | 5/1995 | Gonya et al. |
| 5,414,303 A | 5/1995 | Gonya et al. |
| 5,604,831 A | 2/1997 | Dittman et al. |
| 5,730,932 A | 3/1998 | Sarkhel et al. |
| 5,763,854 A | 6/1998 | Dittman et al. |
| 5,840,432 A * | 11/1998 | Hirai et al. .................. 428/570 |
| 5,866,044 A | 2/1999 | Saraf et al. |
| 5,897,336 A | 4/1999 | Brouillette et al. |

FOREIGN PATENT DOCUMENTS

JP 3-169500 7/1991

* cited by examiner

Primary Examiner—Daniel J. Jenkins
(74) Attorney, Agent, or Firm—Lawrence R. Fraley

(57) ABSTRACT

Lead-free solder metal powder material including two or more metals capable of forming an intermetallic compound and having an unreacted phase and an amorphous phase. Further, a lead-free solder paste is prepared by mixing the powder material with a soldering flux. The powder material is preferably formed using a mechanical milling process.

6 Claims, 2 Drawing Sheets

LEAD-FREE SOLDER POWDER MATERIAL, LEAD-FREE SOLDER PASTE AND A METHOD FOR PREPARING SAME

FIELD OF THE INVENTION

The present invention relates to lead-free solder powder material, lead-free solder paste, and a method for preparing same. More particularly, the present invention relates to lead-free solder powder material having good wettability and a low melting point, lead-free solder paste including such solder powder material, and a method for preparing both.

BACKGROUND OF THE INVENTION

As is known, lead (Pb) is included in many conventional solder alloys. Further, an increasing number of microelectronic devices are prepared by a process using the aforementioned alloys. For environmental reasons, many countries are planning to mandate the exclusion of lead in soldering and other processes at some near future date. Therefore, it is highly desirous to provide a solder alloy free of such lead.

Accordingly, several kinds of lead-free solders are now being developed. These lead-free solders, however, are typically difficult to be effectively used in most manufacturing processes, due primarily to low wettabilities and higher melting points than known (tin-lead) solder alloys.

Various solder alloy compositions, including lead-free types, and processes using same are described in the following patents:

| | | |
|---|---|---|
| 4,806,309 | 5,368,814 | 5,604,831 |
| 4,929,423 | 5,393,489 | 5,730,932 |
| 5,328,660 | 5,411,703 | 5,763,854 |
| 5,344,607 | 5,414,303 | 5,866,044 |
| | | 5,897,336 |

In addition to the foregoing, a method other than a gas atomizing method is described in Laid-Open Japanese Patent Publication No. 3-169500, wherein powder material of predetermined composition and small balls are put in a pot, which is then filled with inactive gas, sealed and rotated. The powder material is mechanically milled by the small balls. This method is mainly used to impart heat-resistance and thermal durability to solder powder material by mixing intermetallic compounds having high melting point with Sn—Pb alloy to make solder powder material. The method is acceptable in that it can prevent the solder powder material from forming large grains and that it does not require heat to melt the powder material during the preparation.

Recently, the use of intermetallic compounds in microelectronic products and processes having high melting points in turn appear to necessitate the use of solder alloy including lead. The aforementioned disadvantages caused by lead cannot be avoided, so it seems, when manufacturing such products. As will be defined hereinbelow, a solder powder material essentially free of lead has been developed which can be effectively used in a manufacturing environment, including particularly one wherein microelectronic products are made. Such a solder possesses both high wettability and a low melting point. It is believed that such a solder will constitute a significant advancement in the art.

OBJECTS AND SUMMARY OF THE INVENTION

One object of the present invention, therefore, is to provide excellent lead-free solder powder material having a low melting point and high wettability when formed into a solder alloy.

Another object of the present invention is to provide lead-free solder paste including such lead-free solder powder material.

Yet another object of the present invention is to provide a method for preparing such lead-free powder material and paste materials.

According to one aspect of the invention, there is provided lead-free solder powder material of metal powder material comprising a combination of two or more metals capable of forming an intermetallic compound, wherein the metal powder material includes an amorphous phase and an unreacted phase of the combination, which is a prior state to forming an intermetallic compound. Please see hereinbelow for definitions of said phases.

According to another aspect of the invention, there is provided a method for preparing lead-free solder powder material comprising the steps of positioning powder material of two or more metals capable of forming an intermetallic compound and small metal balls in a sealed container and moving the metal balls in the sealed container to finely grind the powder material of two or more metals, thereby obtaining a metal powder material including an unreacted phase and an amorphous phase.

BEST MODE FOR CARRYING OUT THE INVENTION

Figure 1:
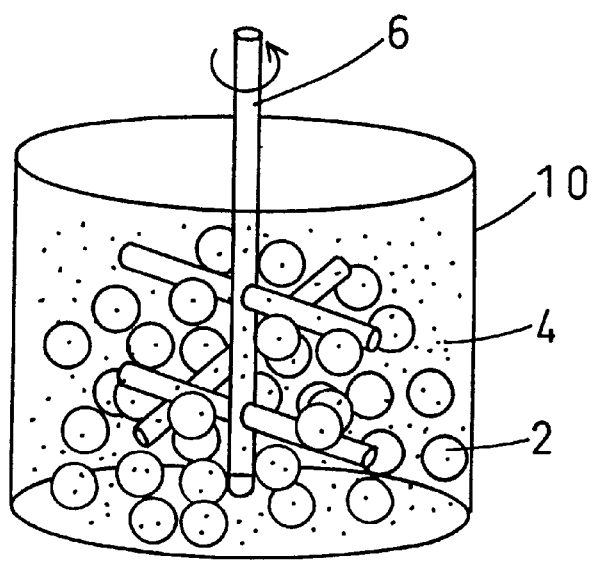
FIG. 1 is a plane view of an apparatus to practice a method for preparing lead-free solder powder material according to one aspect of the present invention.

For a better understanding of the present invention, together with other and further objects, advantages and capabilites thereof, reference is made to the following disclosure and appended claims in connection with the above-described drawings. It is understood that like numerals may be used to indicate like elements from FIG. to FIG.

Lead-free solder powder material of the present invention is metal powder material, before milling, which are mixtures of elemental materials, powders of a single alloy, or combinations of elemental material and alloys, and, after milling, includes an amorphous phase and an unreacted phase of the combination, which is a prior state to forming an intermetallic compound. That is, the solder metal powder made using a milling process as taught herein contains both an "unreacted phase" and/or a "reacted phase". By "unreacted" is meant that no alloy or intermetallic compound is formed. Accordingly, the particle size of the unreacted phase material is only made smaller by said milling process. Stated otherwise, the solder powder contains both an "amorphous" phase and a "crystal" phase, the "amorphous" phase usually contained in the "unreacted" phase, but also possible in the "reacted" phase. The presence of the amorphous phase, as used herein, shall be defined as including broad diffuse peaks, as observed using x-ray diffraction.

Lead-free solder paste of the present invention is prepared by mixing the above-mentioned lead-free solder powder material with a soldering flux.

In a method for preparing lead-free solder powder material of the present invention, powder material and small metal balls are put in a sealed container, and the metal balls are forced to move so that the metal powder material is finely ground.

The preferred method for obtaining such metal powder material is by positioning powder material and a plurality of small metal balls in the sealed container, the container filled with inactive—chemically inert gas, providing mechanical force to the sealed container to move the balls, which movement results in finely grinding the powder material.

As for types of material powder, the combinations of two or more metals of simple elemental substances capable of forming an intermetallic compound are selected. Such combinations capable of forming intermetallic compounds are known to those skilled in the art and any of these can be selected for use in the present invention. The preferred metals included in such combinations are selected from the group consisting of elemental tin (Sn), silver (Ag), copper (Cu), bismuth (Bi), zinc (Zn), indium (In), gold (Au), nickel (Ni), antimony (Sb), palladium (Pd), platinum (Pt), and germanium (Ge). Examples of such combinations include Cu—Sn, Ag—Sn, Au—Sn, Au—Cu, Au—Bi, Au—Zn, Au—In, Au—Sb, Au—Pt, Ni—Sn, Cu—In, Ni—In, Ag—In, Ag—Sb, Ag—Pt, Ag—Zn, Bi—In, Ni—Bi, Cu—Zn, Cu—Sb, Cu—Ge, Cu—Pd, Cu—Pt, Ge—Ni, In—Pd, In—Sb, Ni—Zn, Ni—Sb, Ni—Pt, Pd—Sn, Pt—Sn, Pt—Sb, and Sb—Zn. One or more metals are preferably added to one of the above combinations to in turn make a ternary or polyphyletic combination.

Alloy powder material including at least one or more selected from the group consisting of tin (Sn), silver (Ag), copper (Cu), bismuth (Bi), zinc (Zn), indium (In), gold (Au), nickel (Ni), antimony (Sb), palladium (Pd), platinum (Pt), and germanium (Ge) can be used as the powder material. Such alloy powder material can be produced by combining at least two of the above mentioned metals, or by combining at least one of the above-mentioned metals and other metals. The alloy powder material so obtained (first alloy powder material) is then combined with an elemental powder or another alloy powder material (second alloy powder material), which are both capable of forming an intermetallic compound, to prepare powder material of the present invention. The metal of simple substance combined with the first alloy powder material is preferably selected from the group consisting of tin (Sn), silver (Ag), copper (Cu), bismuth (Bi), zinc (Zn), indium (In), gold (Au), nickel (Ni), antimony (Sb), palladium (Pd), platinum (Pt), and germanium (Ge). The second alloy powder material also preferably comprises at least one or more metals selected from the group consisting of tin (Sn), silver (Ag), copper (Cu), bismuth (Bi), zinc (Zn), indium (In), gold (Au), nickel (Ni), antimony (Sb), palladium (Pd), platinum (Pt), and germanium (Ge).

The diameter of each material powder material is, although not limited, preferably in a range from 100 micrometers to 200 micrometers.

The material and the size of small metal balls used in the present invention are not limited, but balls made of brass or stainless steel with 5 millimeters to 20 millimeters diameters are preferably used.

A container to be used for preparing lead-free solder powder material of the present invention is filled with inactive-chemically inert gas. Inactive gas can be, although not limited, argon gas, nitrogen gas, or the like.

Other than powder material, metal balls, and inactive gas, liquid can be added in the container to prevent powder material from adhering to the internal walls of the container. Such liquid may be, for example, an alcohol, and particularly methyl alcohol.

The container is sealed and then rotated, agitated, or vibrated to move the metal balls therein. Alternatively, a stirring stick or the like may be rotated or vibrated to move the metal balls in the container to in turn mill the powder material for a predetermined period of time. The number of rotations of the container or stirring stick and a corresponding time for milling the powder material is selected depending on the kind of metals to be used. Such a number and time period are selected such that the milled metal powder material is finely ground and includes an unreacted phase, which is a prior state to forming an intermetallic compound. Further, the milled metal powder material is in an amorphous state, i.e., a compositional supercooling state.

The terms "finely ground metal powder material" as used herein means that the diameter of the particle size of the resulting (milled) metal powder material is in a range of about 10 nanometers to about 100 micrometers. Grinding the metal powder material finely lowers the melting point of the resulting solder powder material.

The resulting ground metal powder material, or the solder powder material, may include an unreacted phase which is a prior state to forming an intermetallic compound that can be detected, for example, by the use of a differential scanning calorimeter (DSC). Specifically, a DSC measures the changes in calories when the temperature of the resulting metal powder material is raised or lowered; the melting point of the resulting metal powder material can be calculated based on the changes in calories. The calculated melting point is compared to that of the intermetallic compound derived from the same kinds of metal materials as the resulting metal powder material, which is well known to those skilled in the art, to confirm if the resulting metal powder material includes an unreacted phase.

An amorphous state, or a compositional supercooling state, can be detected by a powder pattern X-ray diffraction analysis.

Any additives including other metal powder material for lowering the melting point of the obtained lead-free solder powder material can be mixed with the powder material. The lead-free solder powder material of the present invention, however, has excellent properties as a solder with low melting point even without additives.

A soldering flux can be added to the lead-free solder powder material so obtained to prepare the lead-free solder paste of the present invention. A general rosin type flux can be used, although the invention is not limited thereto. The melting point of this paste is lower than that of solder powder material or paste with the same metal composition prepared by a conventional fusion method. Further, the lead-free solder paste of the present invention is being reacted to form an intermetallic compound when it is practically used for soldering, even at a temperature under the melting point. The generated reaction heat fuses the solder being used; thereby an actual temperature of melting solder paste is expected to decrease even more.

The usage of lead-free solder powder material or paste of the present invention is not limited. Preferably, these are used to solder various kinds of microelectronics devices, but many other uses are within the knowledge of one skilled in the art.

The present invention will be further described below with reference to the following examples. The formulations of the present invention, however, are not limited to the content of these examples.

FIG. 1 shows an apparatus for producing the lead-free solder powder material of the present invention. Metal balls 2 and powder material 4 of predetermined composition are put in a container 10 and sealed with inactive gas therein. A stirring bar (stick) 6 located in the middle of the container 10 is turned using a motor (not shown). In a method for preparing lead-free solder powder material of the present invention, metal balls 2 are moved in a container 10 randomly. As a result of the movement of the balls, powder material 4 is finely ground. The size of the resulting powder material can be adjusted by varying parameters, such as the rotation rate or rotation time of the stirring bar 6, the size and number of the metal balls, etc.

Figure 2:
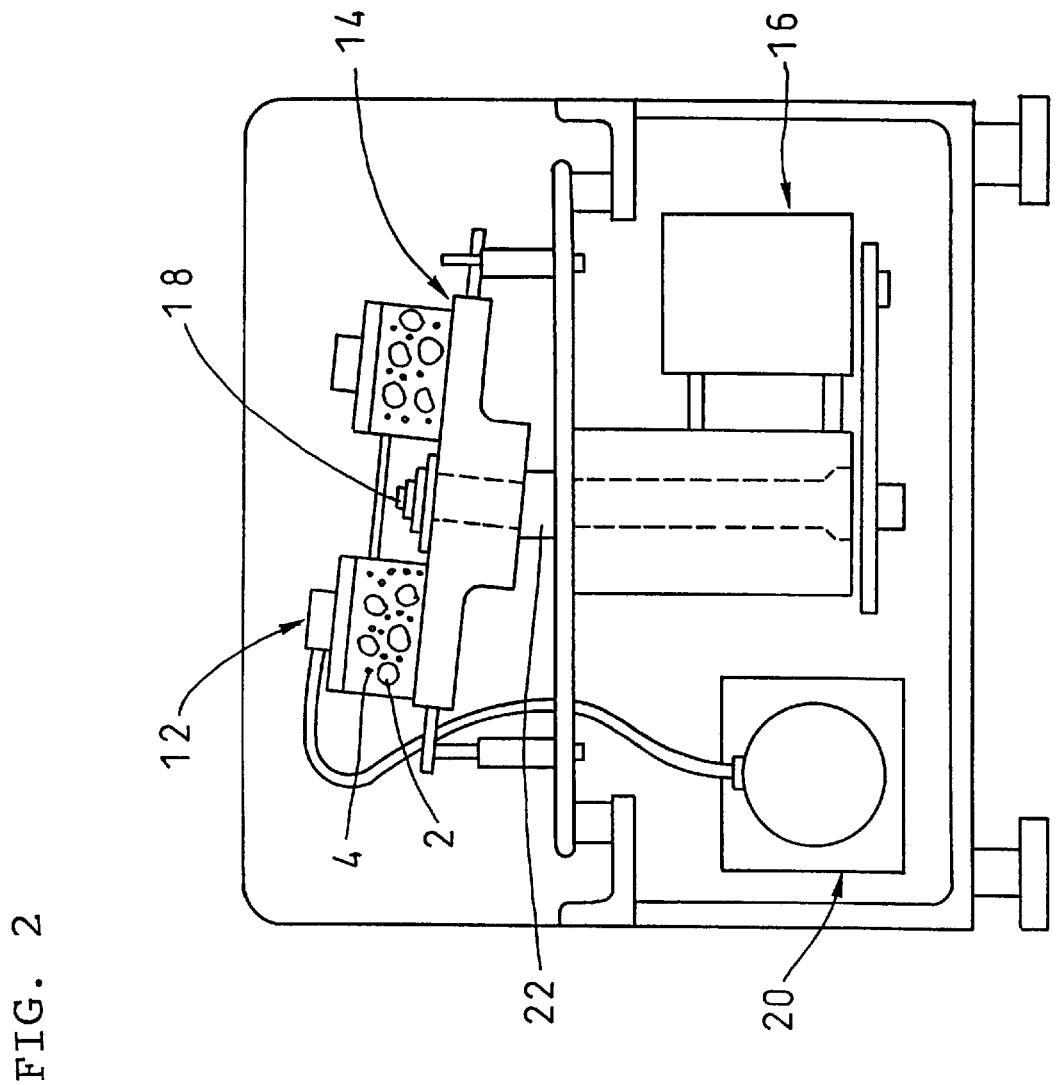
FIG. 2 is a plane view of another apparatus practicing a method for preparing lead-free solder powder material according to one aspect of the present invention.

FIG. 2 shows another apparatus for producing the lead-free solder powder material of the present invention. Metal balls 2 and powder material 4 of a predetermined composition are positioned in chambers 12 and sealed with inactive gas therein. The chambers are put on a vibrating board 14. There is an axis 18 in the center of the vibrating board 14. The board moves upward and downward and rightward and leftward about its axis and is driven by a driving motor 16. Thus the chambers 12 move in such a way that their motion is entirely random. As the result of the movement of the balls, the powder material 4 is finely ground. The size of the resulting powder material can be adjusted by varying parameters, such as the moving speed of the board, the size and number of the metal balls used, etc.

The lead-free solder of the present invention was produced with the use of an apparatus shown in FIG. 2. Stainless steel balls weighing a total of about 36 grams and each having 0.375 inch diameters were combined with about 4 grams of metal powder material having an average 0.50 mm diameters in the two chambers 12. The metal powder material is comprised of Sn, Ag, and Cu in a weight ratio of 95.7:3.5:0.8. Several drops of alcohol, e.g., methyl alcohol, were added (by a dropping pipet) to prevent the powder material from adhering to the walls of the chambers and the metal balls. The chambers were then filled with an argon gas atmosphere to prevent powder material from oxidizing. The containers were sealed during this processing.

One example of one of the apparatus shown in FIG. 2 is a vibrating ball mill (e.g., Super Misumi NEV-MA8, a product of Nisshin Giken). Powder material is milled at 13.1 Hz for 5 hours using this apparatus. The resulting metal powder material was analyzed by a DSC 7 (Perkin Elmer) colorimeter, the temperature increasing at the rate of 10 degrees Celsius/min from 150 degrees Celsius to 250 degrees Celsius to determine a starting point of melting. The point was 213 degrees Celsius.

After the solder powder material obtained in the above example was completely melted, it was resolidified. Then, the obtained metal powder material was analyzed by a DSC 7 (Perkin Elmer) with a temperature increase at the rate of 10 degrees Celsius/min from 150 degrees Celsius to 250 degrees Celsius to determine a starting point of melting. The melting point in this example was 217 degrees Celsius.

Thus the melting point of the solder powder material obtained in the first example above was 4 degrees lower than that of the solder powder material of the second example, which means that the solder powder material obtained in the first example contains an unreacted phase or an amorphous phase.

Since the lead-free solder powder material of the present invention does not include harmful lead, it is substantially safe for use, and the impact on the environment as caused if lead were utilized is eliminated. Products made using the resulting paste can also be discarded without fear of adverse environmental consequences.

The lead-free solder powder material of the present invention includes an unreacted phase and an amorphous phase of two or more metals capable of forming an intermetallic compound. The melting point thereof is lower than that of the intermetallic compound of the same metal composition.

When the lead-free solder paste including the lead-free solder powder material of the present invention is used, the solder paste is reacted to form an intermetallic compound; thus, the solder paste will be melted at a temperature under the melting point. Therefore, soldering with the use of the paste of the present invention can be done at a comparatively low temperatures. This should also result in a longer life for the resulting components.

While there have been shown and described what are at present the preferred embodiments of the invention, it will be obvious to those skilled in the art that various changes and modifications may be made therein without departing from the scope of the invention as defined by the appended claims.

What is claimed is:

1. Lead-free solder metal powder material comprising a combination of two or more metals capable of forming an intermetallic compound, wherein said metal powder material includes an amorphous phase and an unreacted phase of the combination, which is a prior state to forming an intermetallic compound.

2. The lead-free solder metal powder material according to claim 1, wherein at least one of said two or more metals capable of forming said intermetallic compound is selected from the group consisting of tin (Sn), silver (Ag), copper (Cu), bismuth (Bi), zinc (Zn), indium (In), gold (Au), nickel (Ni), antimony (Sb), palladium (Pd), platinum (Pt), and germanium (Ge).

3. The lead-free solder metal powder material according to claim 1 wherein said combination of two or more metals capable of forming an intermetallic compound is one selected from the group consisting of Cu—Sn, Ag—Sn, Au—Sn, Au—Cu, Au—Bi, Au—Zn, Au—In, Au—Sb, Au—Pt, Ni—Sn, Cu—In, Ni—In, Ag—In, Ag—Sb, Ag—Pt, Ag—Zn, Bi—In, Ni—Bi, Cu—Zn, Cu—Sb, Cu—Ge, Cu—Pd, Cu—Pt, Ge—Ni, In—Pd, In—Sb, Ni—Zn, Ni—Sb, Ni—Pt, Pd—Sn, Pt—Sn, Pt—Sb, and Sb—Zn, or is obtained by adding one or more metals to one selected from the group consisting of Cu—Sn, Ag—Sn, Au—Sn, Au—Cu, Au—Bi, Au—Zn, Au—In, Au—Sb, Au—Pt, Ni—Sn, Cu—In, Ni—In, Ag—In, Ag—Sb, Ag—Pt, Ag—Zn, Bi—In, Ni—Bi, Cu—Zn, Cu—Sb, Cu—Ge, Cu—Pd, Cu—Pt, Ge—Ni, In—Pd, In—Sb, Ni—Zn, Ni—Sb, Ni—Pt, Pd—Sn, Pt—Sn, Pt—Sb, and Sb—Zn.

4. The lead-free solder metal powder material according to claim 1 wherein the particle diameter of each solder metal powder material is within the range of from about 10 nanometers to about 100 micrometers.

5. A lead-free solder paste including a composition comprised of the lead-free solder metal powder material of claim 1 and a soldering flux material.

6. The lead-free solder paste according to claim 5 wherein said soldering flux material is a rosin material.

* * * * *